(12) United States Patent
Shreter et al.

(10) Patent No.: US 11,103,960 B2
(45) Date of Patent: Aug. 31, 2021

(54) METHOD OF SEPARATING SURFACE LAYER OF SEMICONDUCTOR CRYSTAL USING A LASER BEAM PERPENDICULAR TO THE SEPARATING PLANE

(71) Applicants: Yury Georgievich Shreter, Saint-Petersburg (RU); Yury Toomasovich Rebane, Saint-Petersburg (RU); Aleksey Vladimirovich Mironov, Saint-Petersburg (RU)

(72) Inventors: Yury Georgievich Shreter, Saint-Petersburg (RU); Yury Toomasovich Rebane, Saint-Petersburg (RU); Aleksey Vladimirovich Mironov, Saint-Petersburg (RU)

( * ) Notice: Subject to any disclaimer, the term of this patent is extended or adjusted under 35 U.S.C. 154(b) by 66 days.

(21) Appl. No.: 16/262,453

(22) Filed: Jan. 30, 2019

(65) Prior Publication Data
US 2019/0160598 A1 May 30, 2019

Related U.S. Application Data

(62) Division of application No. 13/990,359, filed as application No. PCT/RU2011/000943 on Nov. 29, 2011.

(30) Foreign Application Priority Data

Nov. 29, 2010 (RU) ............................ RU2010148544

(51) Int. Cl.
*B23K 26/57* (2014.01)
*B23K 26/00* (2014.01)
(Continued)

(52) U.S. Cl.
CPC .......... *B23K 26/57* (2015.10); *B23K 26/0006* (2013.01); *B23K 26/0622* (2015.10);
(Continued)

(58) Field of Classification Search
CPC ............ B23K 26/0063; B23K 26/0054; B23K 26/57; B23K 26/364; B23K 26/53; H01L 21/78; H01L 21/7813
(Continued)

(56) References Cited

U.S. PATENT DOCUMENTS 4,224,101 A  9/1980 Tijburg et al.
4,546,231 A  10/1985 Gresser et al.
(Continued)

FOREIGN PATENT DOCUMENTS

DE  102007018080 B3  6/2008
DE  102009005303 A1  7/2010
(Continued)

OTHER PUBLICATIONS

International Search Report dated Oct. 17, 2012 issued in International Application No. PCT/RU2011/000943.

*Primary Examiner* — Tu B Hoang
*Assistant Examiner* — Alba T Rosario-Aponte
(74) *Attorney, Agent, or Firm* — Hoffmann & Baron, LLP

(57) ABSTRACT

This invention provides two variations of methods of separating a surface layer of the semiconductor crystal. In the second variation of the method, pulse laser emission is generated; a focused laser beam is directed onto the crystal in such a way that focus is placed in the layer separation plane perpendicular the axis of the beam, a laser beam is moved in such a way that focus is moved in the layer separation plane with forming the non-overlapping local regions with a disturbed topology of the crystal structure and with reduced interatomic bonds, wherein the local regions is distributed over the whole plane, an external action disturbing the reduced interatomic bonds is applied to the separable layer. The invention allows separating flat lateral surface (Continued)

layers from semiconductor crystals, and thin semiconductor washes from cylindrical semiconductor boules.

5 Claims, 14 Drawing Sheets

(51) Int. Cl.
| | | |
|---|---|---|
| *B23K 26/364* | (2014.01) | |
| *B23K 26/0622* | (2014.01) | |
| *B23K 26/40* | (2014.01) | |
| *B28D 5/00* | (2006.01) | |
| *C30B 29/40* | (2006.01) | |
| *C30B 33/06* | (2006.01) | |
| *B23K 26/53* | (2014.01) | |
| *B23K 26/38* | (2014.01) | |
| *B23K 101/40* | (2006.01) | |
| *B23K 103/00* | (2006.01) | |
| *H01L 33/00* | (2010.01) | |

(52) U.S. Cl.
CPC ............ *B23K 26/364* (2015.10); *B23K 26/38* (2013.01); *B23K 26/40* (2013.01); *B23K 26/53* (2015.10); *B28D 5/0011* (2013.01); *C30B 29/406* (2013.01); *C30B 33/06* (2013.01); *B23K 2101/40* (2018.08); *B23K 2103/50* (2018.08); *B23K 2103/56* (2018.08); *H01L 33/0093* (2020.05)

(58) Field of Classification Search
USPC ......... 219/121.67, 121.6, 121.68; 83/15, 16; 438/33, 68, 460
See application file for complete search history.

(56) References Cited

U.S. PATENT DOCUMENTS

| | | | |
|---|---|---|---|
| 5,922,224 A | | 7/1999 | Broekroelofs |
| 8,623,137 B1* | | 1/2014 | Henley .................. C30B 33/06 |
| | | | 117/58 |
| 2002/0078806 A1 | | 6/2002 | Koshi |
| 2005/0194364 A1 | | 9/2005 | Fukuyo et al. |
| 2005/0269575 A1* | | 12/2005 | Peng .................. H01L 21/0254 |
| | | | 257/79 |
| 2006/0201983 A1 | | 9/2006 | Kusama et al. |
| 2008/0061043 A1 | | 3/2008 | Fujii |
| 2008/0182353 A1* | | 7/2008 | Zimmerman .......... B23K 26/40 |
| | | | 438/33 |
| 2009/0056513 A1 | | 3/2009 | Baer |
| 2009/0277314 A1* | | 11/2009 | Henley .................... B26F 3/16 |
| | | | 83/15 |
| 2010/0055874 A1* | | 3/2010 | Henley .................. H01L 31/18 |
| | | | 438/460 |
| 2010/0117199 A1 | | 5/2010 | Eisele |
| 2010/0275990 A1* | | 11/2010 | Shimomura ........ H01L 31/0682 |
| | | | 136/256 |
| 2011/0132549 A1 | | 6/2011 | Sercel |

FOREIGN PATENT DOCUMENTS

| | | |
|---|---|---|
| EP | 2117053 A2 | 11/2009 |
| JP | 2006041430 | 2/2006 |
| JP | 2006-150385 | 6/2006 |
| RU | 2354616 C2 | 11/2008 |
| WO | WO2011/160977 A1 | 12/2011 |

* cited by examiner

METHOD OF SEPARATING SURFACE LAYER OF SEMICONDUCTOR CRYSTAL USING A LASER BEAM PERPENDICULAR TO THE SEPARATING PLANE

CROSS-REFERENCE TO RELATED APPLICATIONS

This application is a divisional of U.S. application Ser. No. 13/990,359, filed on 29 May 2013, which is the U.S. National Phase of, and Applicants claim priority from, International Application No. PCT/RU2011/000943, filed on Nov. 2011, and Russian Patent Application No. 2010148544, filed on 29 Nov. 2010, all of which are incorporated herein by reference in their entirety.

TECHNICAL FIELD

Group of the inventions relates to laser treatment of hard materials, in particular, to the method of separating surface layer of semiconductor crystals by means of a laser including laser cutting.

BACKGROUND ART

Laser cutting of semiconductor crystals is widely used during the last ten years and is one of the main methods of separating semiconductor instrument structure into separate chips (see patents U.S. Pat. Nos. 4,224,101, 5,922,224). This separation can be carried out by means of vertical laser cutting of the semiconductor crystal 101 piece into separate chips, scheme 100 of which is given in FIG. 1, or by means of vertical laser cutting of the semiconductor washer. With the method of vertical laser cutting, focused laser beam 102 is moved in the plane parallel to its axis 103 which leads to a vertical flat cut 104 parallel towards the axis 103 of the focused laser beam 102 and perpendicular to the crystal surface 105, through which laser emission enters the crystal 101. When focusing laser beam on the crystal surface, vertical flat cut 104 is formed at the expense of the thermal chemical decomposition or evaporation of the crystal in the vicinity 106 of the laser beam focus.

The drawback of the cutting method with the beam focusing onto the crystal surface is overdeposition of the part of the evaporated material on the cut edges, and microcracks on the cut edges, caused by thermal stresses (U.S. Pat. No. 7,682,937). This leads to an additional consumption of the expensive semiconductor material and to the necessity of removing the overdeposited material by means of chemical etching as described in patents U.S. Pat. Nos. 4,224,101, 7,682,937.

Provided in patents U.S. Pat. Nos. 7,547,613, 7,626,137, method of vertical laser cutting with focusing of pulse laser emission under the upper surface of the transparent semiconductor crystal within the crystal allows avoiding overdeposition of evaporated material and additional consumption of the semiconductor material. Scheme of cutting with focusing of laser beam under the upper surface of the transparent semiconductor crystal 200 is given in FIG. 2. With this method of cutting, local regions 206 are formed in the cutting plane near the positions of the laser beam focus, within which the structure of chemical bonds is disturbed, chemical interaction between atoms is reduced and mechanical strength of the crystal is decreased.

Movement of the laser beam in vertical plane 204 perpendicular to the surface 105 of crystal 101 and parallel to the axis 103 of the focused laser beam 102 allows creating the ordered set of the local regions 206 being in a single vertical plane 204, FIG. 2. Since mechanical strength of the vertical plane 204 with a set of local regions 206 is significantly reduced, then in applying an external mechanical or thermomechanical stress, crystal splits along this vertical plane (see patents U.S. Pat. Nos. 7,547,613, 7,626,137).

The above methods of vertical laser cutting allow cutting the semiconductor crystals 101, FIG. 1 and FIG. 2, and semiconductor washers into separate chips, but not able to provide separation of the semiconductor instrument structures from the crystal substrates in horizontal plane or semiconductor washers from cylindrical semiconductor boules. This invention provides two variations of the method of separating surface layer of the semiconductor crystal which allow solving these problems.

SUMMARY

This invention provides two variations of the method of separating surface layer of the semiconductor crystal. In one variation of the method, separation is carried out by means of laser cutting. For this, the focused laser beam is directed on the crystal in such a way, that focus is in the layer separation plane perpendicular to the axis of the beam, laser beam is moved with scanning the layer separation plane with focus in the direction from the open side crystal surface deep into forming a continuous slit width of which increases with every pass of the beam. The previous operation is performed up to separation of the surface layer.

To separate layer from the crystal in the form of cylindrical boule, scanning of the layer separation plane is carried out from the side cylindrical surface deep into on a spiral path.

To separate layer from the crystal in the form of parallelepiped, scanning of the layer separation plane is carried out by reciprocal movement of the beam with single step shift forming path of the focus movement in the form of meander.

In the preferred embodiment, a crystal or a crystal boule can be previously heated up to 100-1000° C. to avoid cracking of the crystal.

In another variation of the method of separating surface layer of the semiconductor crystal, provided in the scope of this invention, pulse laser emission is generated, focused laser beam is directed on the crystal in such a way, that focus is in the layer separation plane perpendicular towards the axis of the beam, the laser beam is moved in such a way that focus is moved in layer separation plane forming non-overlapping local regions with disturbed topology of the crystal structure and with reduced interatomic bonds, wherein the local regions are distributed over the whole the plane. Then an external action is applied to the separable layer which destroys the reduced interatomic bonds.

An external action can be mechanical or thermomechanical.

Thermomechanical action can be provided with use of the metal plate attached to the external surface of the separable layer and by heating to 50-1000° C. Distance between the centers of the non-overlapping local regions can constitute 0.03-0.3 of the separable layer thickness.

This invention differs from the existing prototypes shown in FIG. 1 and FIG. 2 in that the laser beam is always focused under the crystal surface and its focus is moved in horizontal plane parallel to the crystal surface through which laser beam enters the crystal, and perpendicular to the focused laser beam (this plane is referred to hereinafter as lateral plane).

In the first variation of the method, in the layer separation plane thermal chemical decomposition or evaporation of the crystal in the vicinity of the laser beam focus occurs, wherein this plane is parallel to the separable surface of the crystal. Thus, the method provided allows cutting semiconductor crystals and boules, separating the surface layers from the semiconductor crystals, semiconductor washers from cylindrical semiconductor boules. In application to semiconductor crystals and cylindrical semiconductor boules with grown surface instrument structures, the method provided allows separating thin semiconductor layers and thin semiconductor washers with grown instrument structures from semiconductor crystals and cylindrical semiconductor boules.

In the second variation of the method, when using short laser pulses of medium power, thermal chemical decomposition or evaporation of the crystal in the vicinity of the laser beam focus does not occur, laser beam generates local regions in which the structure of chemical bonds is disturbed, chemical interaction between atoms is reduced, and mechanical crystal strength is decreased.

In this case, movement of the laser beam focus in the horizontal plane parallel to the crystal surface through which laser beam enters the crystal, and perpendicular to the axis of the focused laser beam cone, leads to creation of a set of the non-overlapping local regions with disturbed structure of the chemical bonds in the layer separation plane which is placed under the separable surface of the crystal in the depth defined by the depth of laser beam focusing. Since mechanical strength of the crystal in the separation plane with the set of the local regions is significantly reduced, then in applying external mechanical or thermomechanical stress, crystal splits along this plane with separating the surface layer lying higher or lower the separation plane depending on the depth of the laser beam focusing.

Separation method according to the second variation allows cutting the semiconductor crystals and boules laterally separating the surface layers from the semiconductor crystals, semiconductor washers from cylindrical semiconductor boules without loss of semiconductor material. In application to semiconductor crystals and cylindrical semiconductor boules with grown surface instrument structures, the second variation of the method allows separating thin semiconductor layers and thin semiconductor washers with grown surface instrument structures from semiconductor crystals and cylindrical semiconductor boules respectively.

Provided variations of the inventive method of separating surface layer of semiconductor crystal (used hereinafter as "laser cutting") allows separating flat surface layers from semiconductor crystals, in particular, surface layers with semiconductor instrument structures from semiconductor crystals. Besides, the provided methods allow separating semiconductor washers from cylindrical semiconductor boules including thin semiconductor washers with instrument structures.

BRIEF DESCRIPTION OF THE DRAWINGS

This invention is illustrated by the drawings.

FIG. 1 is a scheme illustrating the known prior art method of vertical laser cutting of semiconductor crystal using a high focused laser emission leading to a thermal chemical decomposition or evaporation of the crystal in the vicinity of the laser beam focus.

FIG. 2 is a scheme illustrating the known prior art method of vertical laser cutting of semiconductor crystal using a focused pulse laser emission creating the local regions in the vertical plane.

FIG. 3 is a scheme illustrating the first variation of the method of separating a surface layer of the semiconductor crystal.

FIG. 4 is a scheme illustrating the first variation of the method of separating a thin semiconductor layer comprising a grown instrument structure under its upper surface, from the semiconductor crystal.

FIG. 5 is a scheme illustrating the first variation of the method of separating a thin semiconductor layer comprising a grown instrument structure in its base, from the semiconductor crystal.

FIG. 6 is a scheme illustrating the second variation of the method of separating a surface layer of the semiconductor crystal.

FIG. 7 is a scheme illustrating the second variation of the method of separating a thin semiconductor layer comprising a grown instrument structure under its upper surface, from the semiconductor crystal.

FIG. 8 is a scheme illustrating the second variation of the method of separating a thin semiconductor layer comprising a grown instrument structure in the base, from the semiconductor crystal.

FIG. 9 is a scheme illustrating the first variation of the method of separating a surface layer of the semiconductor boule into semiconductor washers.

FIG. 10 is a scheme illustrating the first variation of the method of separating a thin semiconductor washer comprising a grown instrument structure under its upper surface, from the semiconductor boules.

FIG. 11 is a scheme illustrating the first variation of the method of separating a thin semiconductor washer comprising a grown instrument structure in the base, from the semiconductor boules.

FIG. 12 is a scheme illustrating the second variation of the method of separating a surface layer of the semiconductor boules into semiconductor washers.

FIG. 13 is a scheme illustrating the second variation of the method of separating a thin semiconductor washer comprising a grown instrument structure under its upper surface, from the semiconductor boules.

FIG. 14 is a scheme illustrating the second variation of the method of separating a thin semiconductor washer, comprising a grown instrument structure in its base, from the semiconductor boules.

DETAILED DESCRIPTION

The present invention will become readily apparent from the following detailed description of exemplary embodiments. It should be noted that the consequent description of these embodiments is only illustrative, but not exhaustive.

For realizing the method, this invention uses laser emission of $\lambda$ wavelength within the region of relative semiconductor transparency, namely between the edge of the main absorption and the region of the residual beams.

Preferably, wavelength $\lambda$ of the laser beam is in the range of $2\pi c\hbar/E_g \leq \lambda \leq c/v_0$, where $E_g$ is a width of the forbidden gap for cutable semiconductor, $v_0$ is a frequency of the optical phonon for cutable semiconductor, c is a velocity of light, $\hbar$ is Plank constant.

As follows from the above inequality, the preferred laser beam wavelength for lateral cutting of the silicon, germanium and gallium arsenide semiconductor is in the range of 0.8 µm≤λ≤20 µm, for gallium nitride it is in the range of 0.35 µm≤λ≤10 µm, and for aluminum nitride it is in the range of 0.2 µm≤λ≤8 µm.

Example 1

Figure 1:
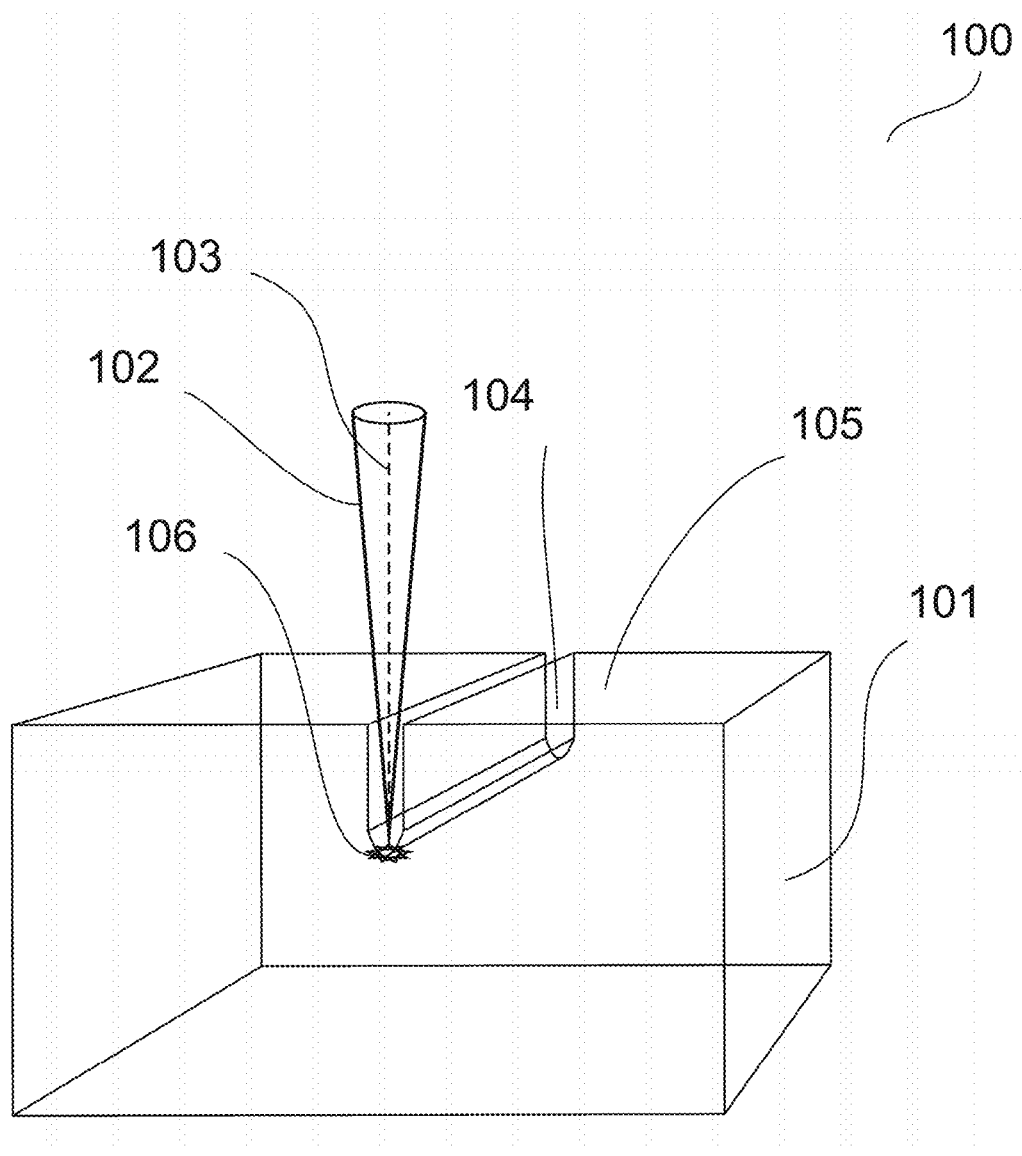
FIG. 1 and FIG. 2 show prior art and FIGS. 3-14 show various embodiments of this invention.
Figure 2:
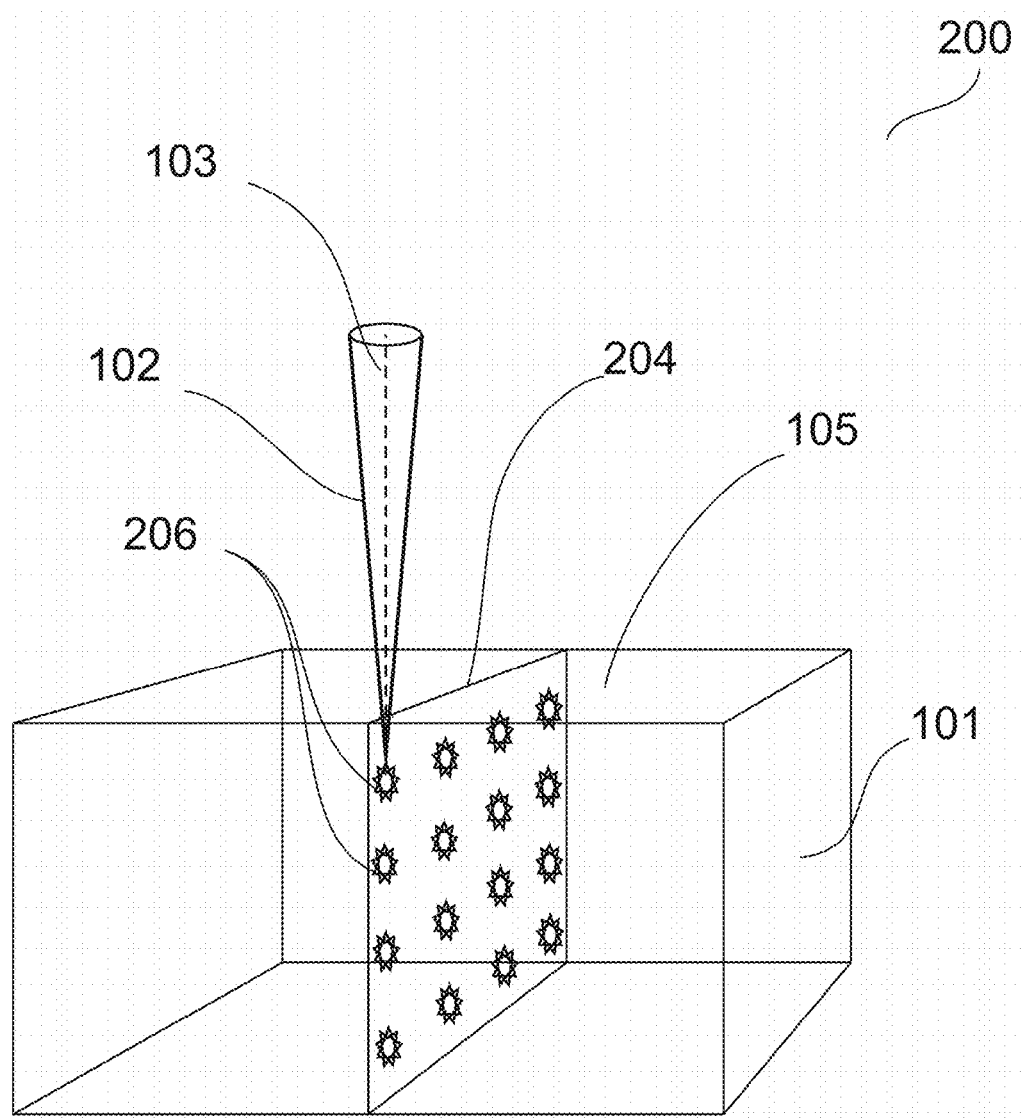
Figure 3:
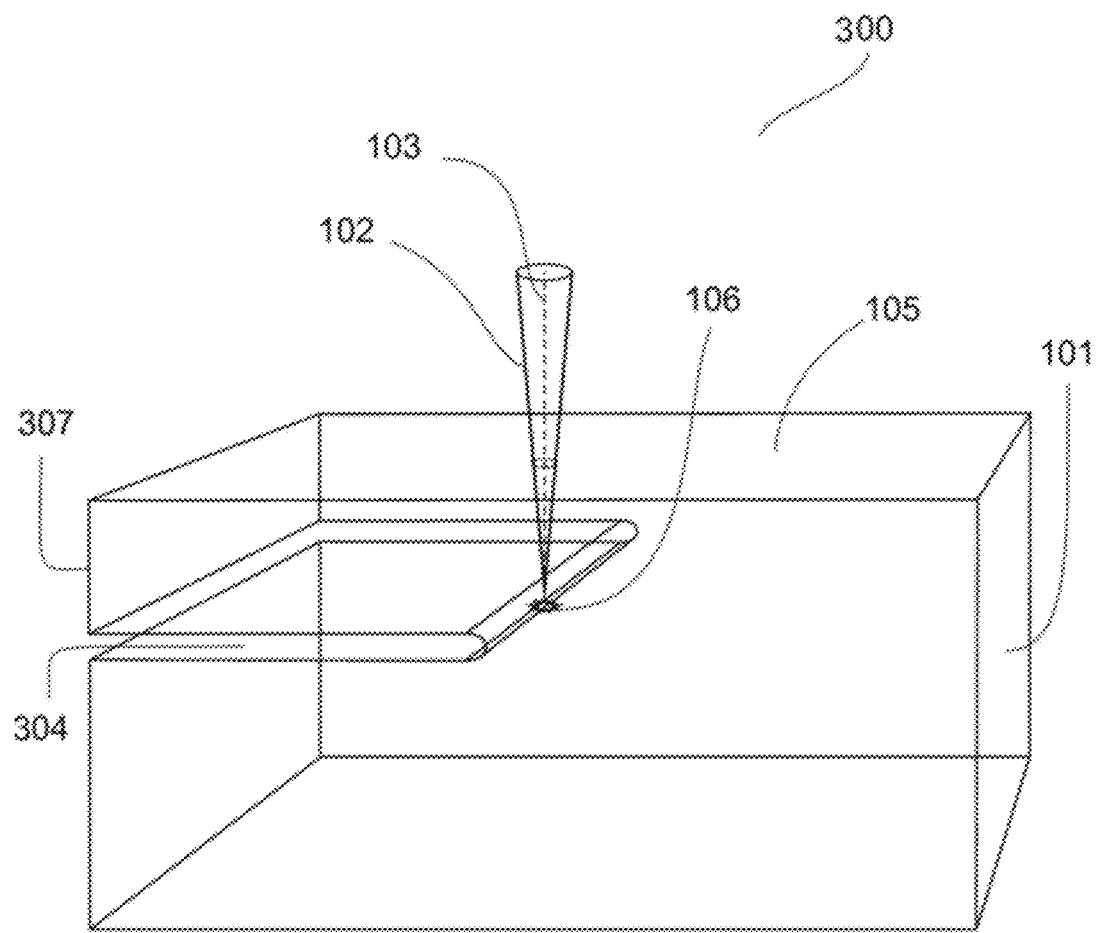

FIG. 3 shows the scheme 300 illustrating the first variation of the method by the example of separating the surface layer of the gallium nitride semiconductor crystal. For this purpose Nd:YAG laser is used which operates in the mode of modulated Q-factor, with frequency doubling and generates light pulses with λ=532 nm, energy of 5 µJ, duration of 5 ns and repetition rate of 1000 Hz. Laser beam is focused to the spot of 16 µm in diameter which provides energy density of 2 J/cm².

Under action of the Nd:YAG laser beam 102 with wavelength λ=532 nm weakly absorbed in the gallium nitride crystal 101, focused under the upper crystal surface 105 at the depth of 100 µm, the crystal 101 is locally heated up to temperature higher than 900° C. leading to chemical decomposition of gallium nitride crystal 101 into gaseous nitrogen and liquid gallium in the vicinity 106 of the laser beam focus. Movement of the laser beam 102 focus at velocity of 1.5 cm/s in the horizontal (lateral) plane parallel to the crystal surface 105 through which laser beam enters the crystal 101, and perpendicular towards the axis 103 of the focused laser beam 102, lead to consequent decomposition of gallium nitride and to increase of width of the lateral cut 304 from left to right deep into the crystal 101. On achieving by the lateral cut 304 the right bound of the crystal in FIG. 3, continuity of the crystal 101 is disturbed and the upper layer 307 being higher than the cut 304 is separated from the main crystal 101. To avoid cracking of the gallium nitride crystal 101 caused by thermal stresses, laser cutting is performed at temperature $T_p$=600° C.

Example 2

Figure 4:
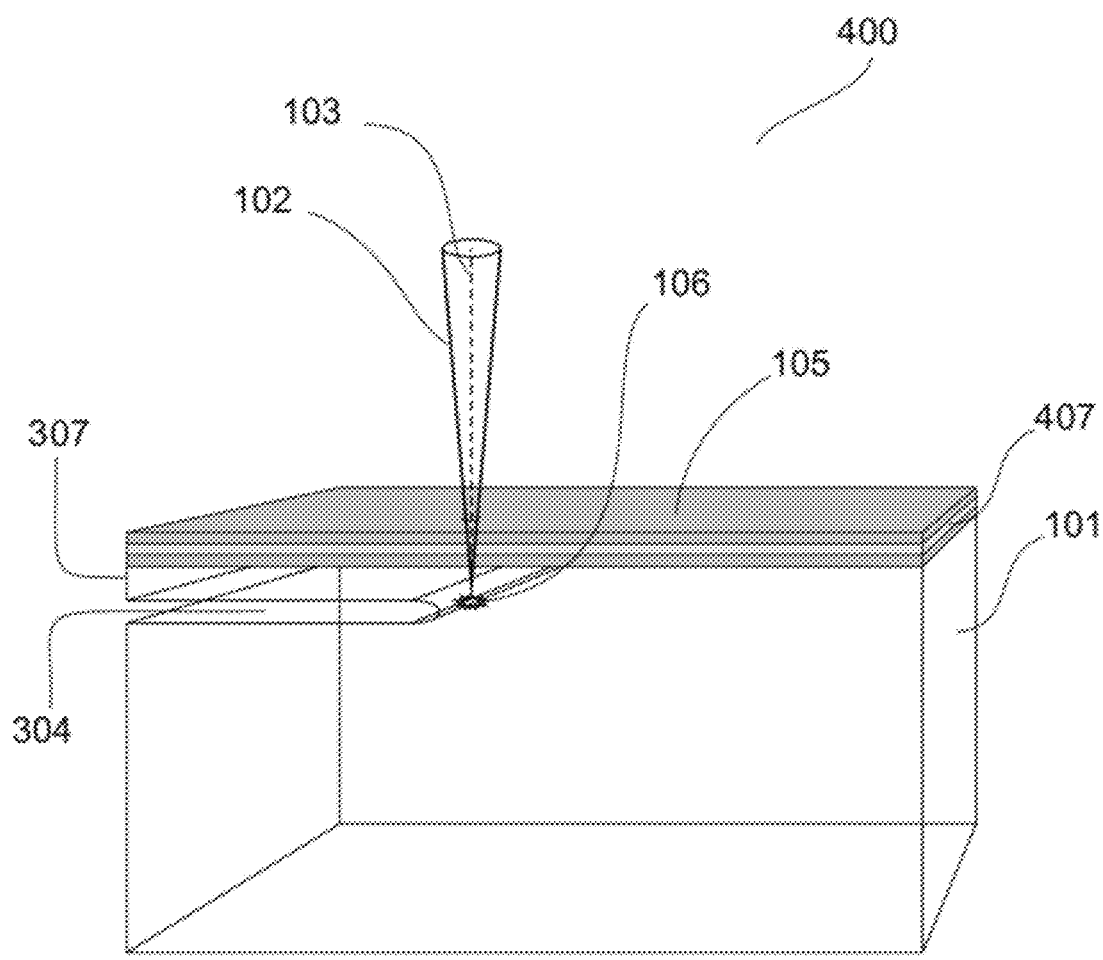

FIG. 4 shows the scheme 400 illustrating the first variation of the method by the example of separating a thin semiconductor layer comprising a grown light diode structure AlGaN/InGaN/AlGaN under the upper surface, from semiconductor crystal. For this purpose Nd:YAG laser is used which operates in the mode of modulated Q-factor, and generates light pulses with λ=532 nm, energy of 5 µJ, duration of 5 ns and repetition rate of 1000 Hz. Laser beam is focused to the spot of 16 µm in diameter which provides energy density of 2 J/cm².

Under action of the Nd:YAG laser beam 102 with wavelength λ=532 nm weakly absorbed in the gallium nitride crystal 101 and in the light diode structure 407 AlGaN/InGaN/AlGaN, focused under the crystal surface 105 at the depth of 50 µm, the crystal 101 is locally heated up to temperature higher than 900° C. leading to chemical decomposition of gallium nitride crystal 101 into gaseous nitrogen and liquid gallium in the vicinity 106 of the laser beam focus. Movement of the laser beam 102 focus at velocity of 1.5 cm/s in the horizontal plane parallel to the crystal surface 105 through which laser beam enters the crystal 101, and perpendicular towards the axis 103 of the focused laser beam 102, leads to consequent decomposition of gallium nitride and to increase of width of the cut 304 in the horizontal plane from left to right deep into the crystal 101. On achieving by the lateral cut 304 the right bound of the crystal in FIG. 4, continuity of the crystal 101 is disturbed and the upper layer 307 with grown light diode structure 407 AlGaN/InGaN/AlGaN lying higher than the cut 304 is separated from the main crystal 101. To avoid cracking of the gallium nitride crystal caused by thermal stresses, laser cutting is performed at temperature $T_p$=600° C.

Example 3

Figure 5:
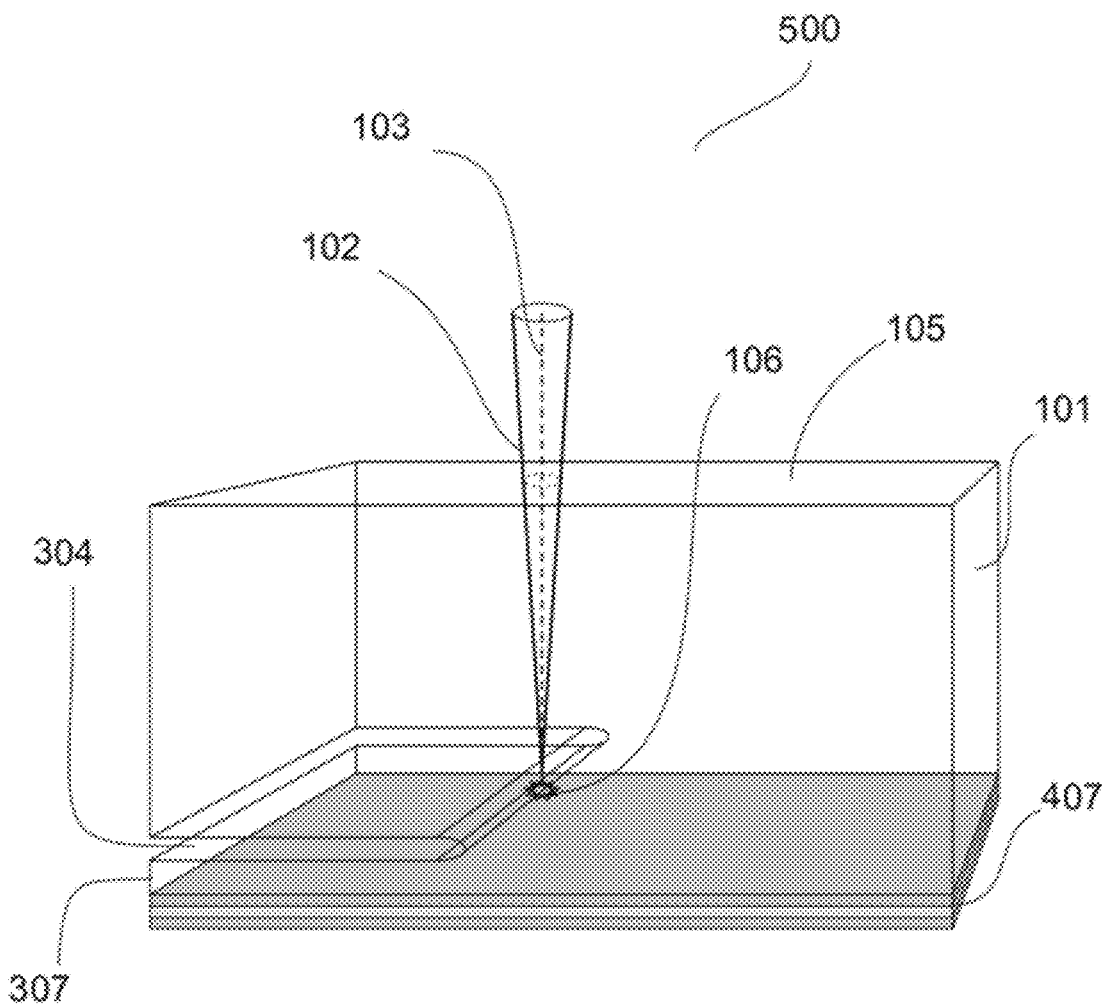

FIG. 5 is a scheme 500 illustrating the first variation of the method by the example of separating a thin semiconductor layer comprising a grown light diode structure AlGaN/InGaN/AlGaN in the base, from semiconductor crystal.

For this purpose, Nd:YAG laser is used which operates in the mode of modulated Q-factor at λ=532 nm, and generates pulses with energy of 5 µJ, duration of 5 ns and repetition rate of 1000 Hz. Laser beam is focused to the spot of 16 µm in diameter which provides energy density of 2 J/cm². Under action of the Nd:YAG laser beam 102 with wavelength λ=532 nm weakly absorbed in the gallium nitride crystal 101, but absorbed in the light diode structure 407 AlGaN/InGaN/AlGaN, focused deeply under the upper crystal surface 105, the crystal 101 is locally heated up to temperature higher than 900° C. leading to the chemical decomposition of gallium nitride crystal 101 into gaseous nitrogen and liquid gallium in the vicinity 106 of the laser beam focus. Movement of the laser beam 102 focus at velocity of 1.5 cm/s in the horizontal plane parallel to the crystal surface 105 through which laser beam enters the crystal 101, and perpendicular towards the axis 103 of the focused laser beam 102, leads to consequent decomposition of gallium nitride and to increase of width of the cut 304 in the horizontal plane from left to right deep into the crystal 101. On achieving by the lateral cut 304 the right bound of the crystal in FIG. 5, continuity of the crystal 101 is disturbed and the lower layer 307 with grown light diode structure 407 AlGaN/InGaN/AlGaN lying lower than the cut 304 is separated from the main crystal 101.

Example 4

Figure 6:
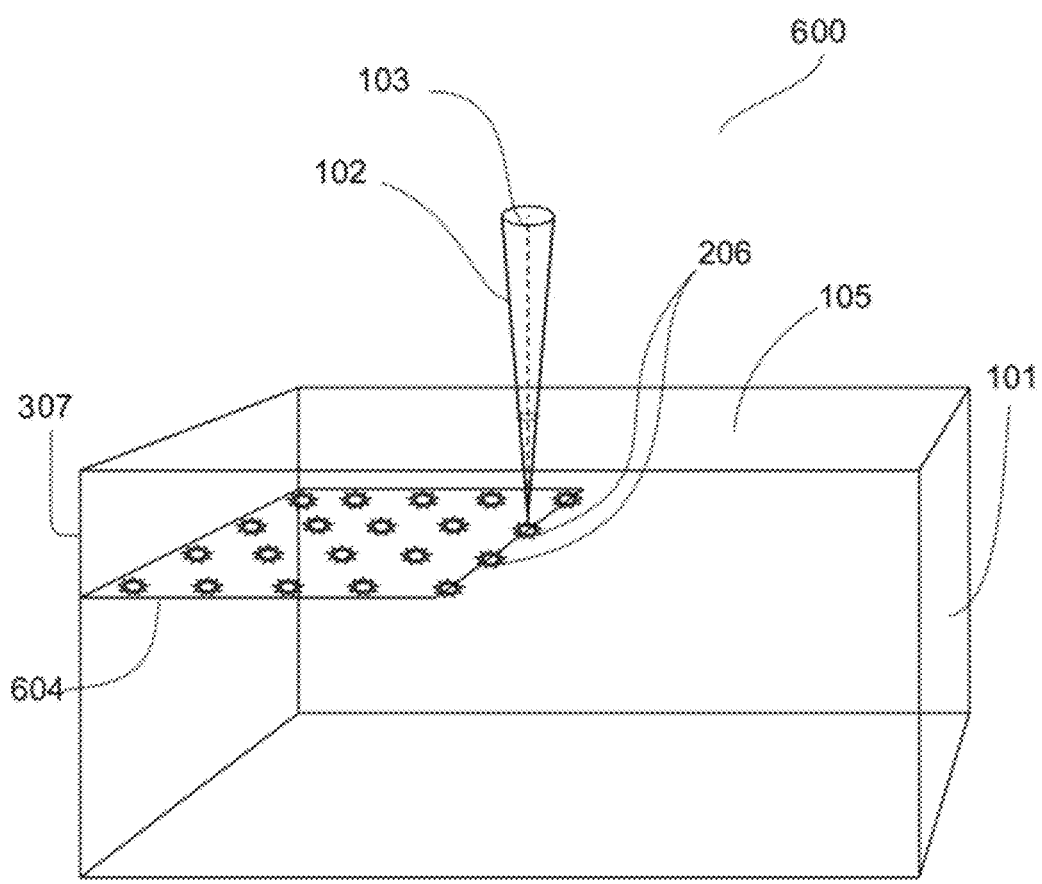

FIG. 6 is a scheme 600 illustrating the second variation of the method by the example of separating the surface layer of the gallium arsenide semiconductor crystal. For this purpose Nd:YAG laser is used which operates in the mode of modulated Q-factor at λ=1064 nm, and generates pulses with energy of 5 µJ, duration of 5 ns and repetition rate of 1000 Hz. Laser beam is focused to the spot of 2 µm in diameter which provides energy density of 2.5 J/cm².

Under action of the Nd:YAG laser beam 102 with wavelength λ=1064 nm weakly absorbed in the gallium arsenide crystal 101, focused under the upper crystal surface 105 at the depth of 100 µm, non-overlapping local regions 206 are formed in which structure of chemical bonds is disturbed, chemical interaction between atoms is reduced and mechanical strength of the crystal is decreased. Movement of the laser beam 102 focus at velocity of 1 cm/s in the horizontal plane parallel to the crystal surface 105 through which laser beam enters the crystal 101, and perpendicular to the axis 103 of the focused laser beam 102, leads to formation of a set of non-overlapping local regions 206 in the plane 604 which is placed under the crystal surface 105 at the depth defined by focusing depth of the laser beam 102. The average distance between the local regions 206 equals 10 µm. When scanning and moving the focused laser beam 102 in the horizontal plane from left to right, area of the section plane 604 with a set of the local regions is increased from left to right deep into the crystal up to the right bound of the crystal 101 in FIG. 6. Laser treatment is performed at room temperature $T_p$=20° C.

At this point, the process of laser treatment is completed. Then crystal 101 is adhered with upper surface 105 on the aluminium plate and heated to the temperature of 100-500° C. In this case, because of thermomechanical stress related with difference between the thermal expansion coefficients of gallium arsenide and aluminium arsenide, crystal 101 splits along the mechanically reduced plane 604 with separating a surface lateral layer lying higher the plane 604 from the main gallium arsenide crystal.

Example 5

Figure 7:
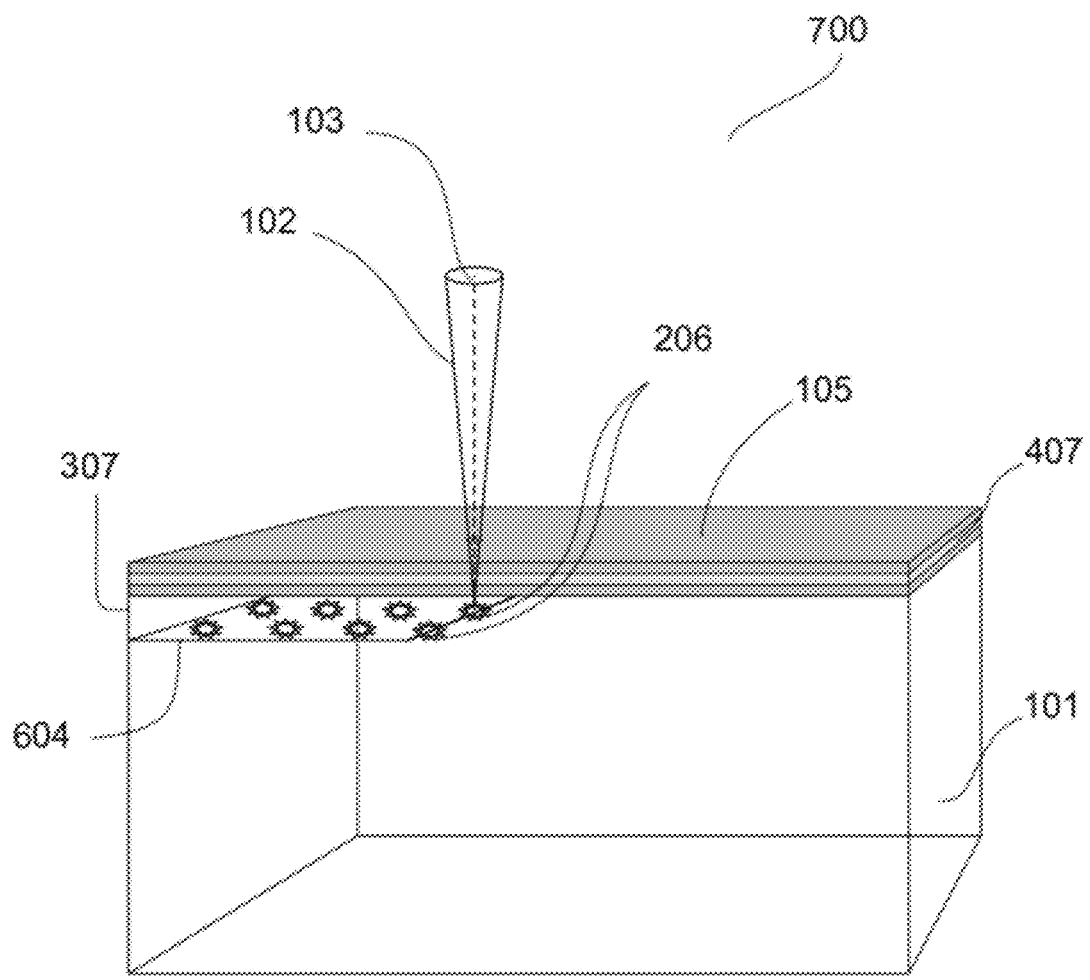

FIG. 7 is the scheme 400 illustrating the second variation of the method by the example of separating a thin semiconductor layer comprising a grown light diode structure AlGaN/InGaN/AlGaN under the upper surface, from semiconductor crystal. For this purpose, Nd:YAG laser is used which operates in the mode of modulated Q-factor, and generates light pulses with $\lambda=532$ nm, energy of 5 µJ, duration of 5 ns and repetition rate of 1000 Hz. Laser beam is focused to the spot of 16 µm in diameter which provides energy density of 2 J/cm².

Under action of the Nd:YAG laser beam 102 with wavelength $\lambda=532$ nm weakly absorbed in the gallium nitride crystal 101 and in light diode structure 407 AlGaN/InGaN/AlGaN, focused under the upper crystal surface 105 at the depth of 50 µm, non-overlapping local regions 206 are formed in which structure of chemical bonds is disturbed, chemical interaction between atoms is reduced and mechanical strength of the crystal 101 is decreased. Movement of the laser beam 102 focus at velocity of 5 cm/s in the horizontal plane parallel to the crystal surface 105 through which laser beam enters the crystal 101, and perpendicular to the axis 103 of the focused laser beam 102, leads to formation of a set of non-overlapping local regions 206 in the lateral separation plane 604 which is placed under the crystal surface 105 at the depth defined by focusing depth of the laser beam 102. The average distance between the local regions equals 5 µm. When scanning laser beam 102 with focus in the horizontal plane from left to right, area of the section plane 604 with a set of the local regions is increased from left to right deep into the crystal up to the right bound of the crystal 101 in FIG. 7. Laser treatment is performed at room temperature $T_p=20°$ C.

At this point, the process of laser treatment is completed. Then crystal 101 is adhered with upper surface 105 on the aluminium plate and heated to the temperature of 100-500° C. In this case, because of thermomechanical stress related with difference between the thermal expansion coefficients of gallium nitride and aluminium nitride, the crystal 101 splits along the mechanically reduced plane 604 with separating a surface lateral layer 307 with light diode structure 407 AlGaN/InGaN/AlGaN lying higher the plane 604 from the main gallium nitride crystal 101.

Example 6

Figure 8:
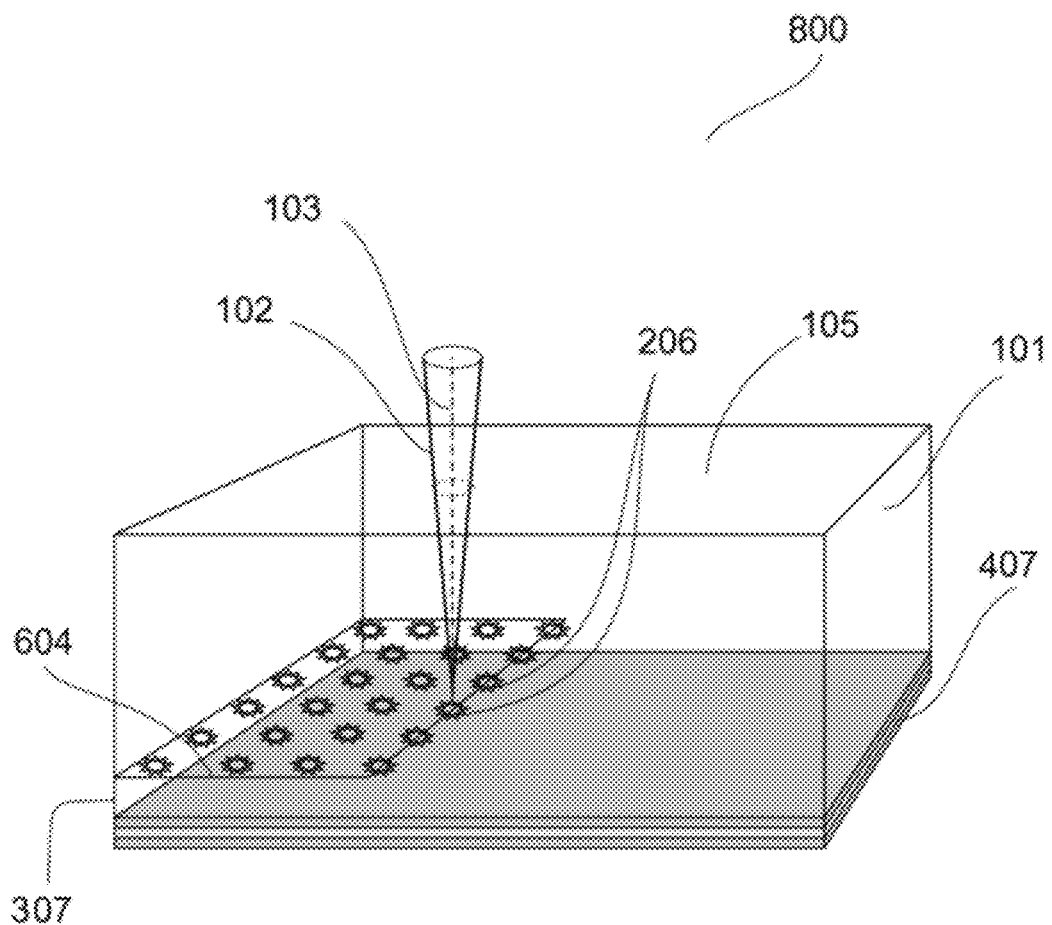

FIG. 8 is a scheme 800 illustrating the second variation of the method by the example of separating a thin semiconductor layer comprising a grown light diode structure AlGaN/InGaN/AlGaN in the base, from semiconductor crystal.

For this purpose Nd:YAG laser is used which operates in the mode of modulated Q-factor at $\lambda=532$ nm, and generates pulses with energy of 50 µJ, duration of 5 ns and repetition rate of 10000 Hz. Laser beam is focused to the spot of 1 µm in diameter which provides energy density of 5 J/cm².

Under action of the Nd:YAG laser beam 102 with wavelength $\lambda=532$ nm weakly absorbed in the gallium nitride crystal 101, but absorbed in the light diode structure 407 AlGaN/InGaN/AlGaN, focused deep under the upper crystal surface 105, non-overlapping local regions 206 are formed in which structure of chemical bonds is disturbed, chemical interaction between atoms is reduced and mechanical strength of the crystal is decreased. Movement of the laser beam 102 focus at velocity of 5 cm/s in the horizontal plane parallel to the crystal surface 105 through which laser beam enters the crystal 101, and perpendicular to the axis 103 of the focused laser beam 102, leads to formation of the non-overlapping local regions 206 in the lateral plane 604 which lies under the crystal surface 105 at the depth defined by the depth of the laser beam 102 focusing. The average distance between the local regions equals 5 µm. When scanning laser beam 102 with focus in the horizontal plane from left to right, area of the section plane 604 with a set of the local regions is increased from left to right deep into the crystal up to the right bound of the crystal 101 in FIG. 8. Laser treatment is performed at room temperature $T_p=20°$ C.

At this point process of laser treatment is completed. Then crystal 101 is adhered with upper surface 105 on the aluminium plate and heated to the temperature of 100-500 C. In this case, because of thermomechanical stress related with difference between the thermal expansion coefficients of gallium nitride and aluminium nitride, crystal 101 splits along the mechanically reduced plane 604 with separating a lower lateral layer 307 with light diode structure AlGaN/InGaN/AlGaN lying lower the plane 604 from the main gallium nitride crystal.

Example 7

Figure 9:
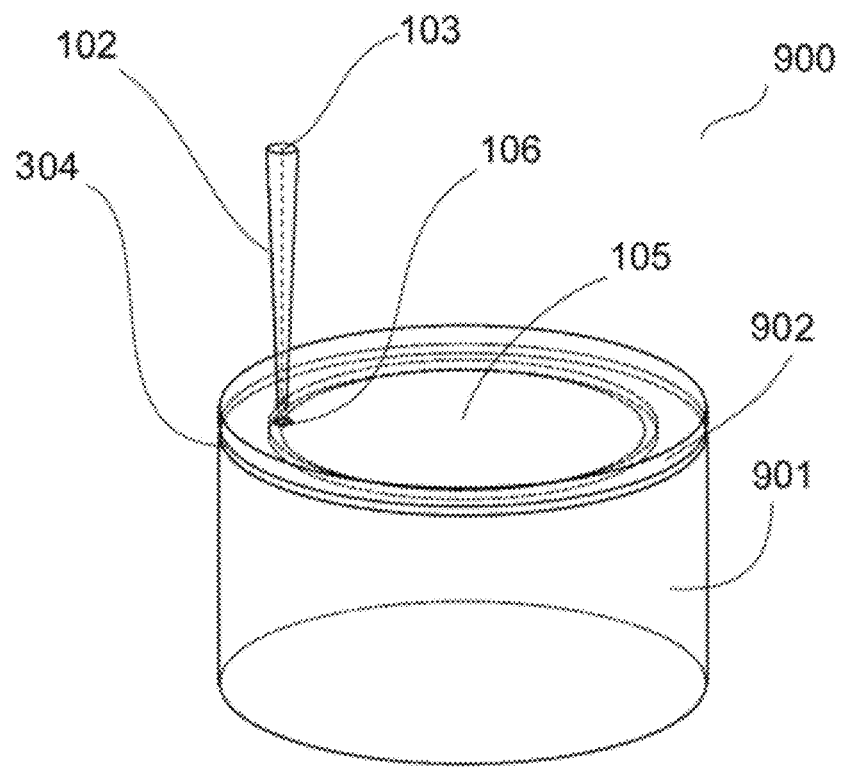

FIG. 9 is a scheme 900 illustrating the first variation of the method by the example of separating a surface layer of the semiconductor cylindrical gallium nitride boule. For this purpose Nd:YAG laser is used which operates in the mode of modulated Q-factor at $\lambda=532$ nm, and generates pulses with energy of 5 µJ, duration of 5 ns and repetition rate of 1000 Hz. Laser beam is focused to the spot of 16 µm in diameter which provides energy density of 2 J/cm².

Under action of the Nd:YAG laser beam 102 with wavelength $\lambda=532$ nm focused under the surface 105 at the depth of 200 µm of the cylindrical gallium nitride boule 901, the crystal is locally heated up to temperature higher than 900° C. leading to chemical decomposition of gallium nitride crystal into gaseous nitrogen and liquid gallium in the vicinity 106 of the laser beam focus.

Movement of the laser beam 102 focus on a spiral path at velocity of 1.5 cm/s in the horizontal plane parallel to the crystal surface 105 through which laser beam enters the crystal, and perpendicular to the axis 103 of the focused laser beam 102, leads to consequent decomposition of gallium nitride and to increase of width of the lateral cut 304 on a spiral path from periphery deep into the crystal towards the axis of the cylindrical boule 901. On achieving by the lateral cut 304 the axis of the cylindrical boule 901 in FIG. 9, continuity of the cylindrical gallium nitride boule 901 is disturbed and gallium nitride washer 902 being higher than the cut 304 is separated from the cylindrical gallium nitride boule 901. To avoid cracking of the separable gallium nitride washer 902 caused by thermal stresses, laser cutting is performed at temperature $T_p=600°$ C.

Example 8

Figure 10:
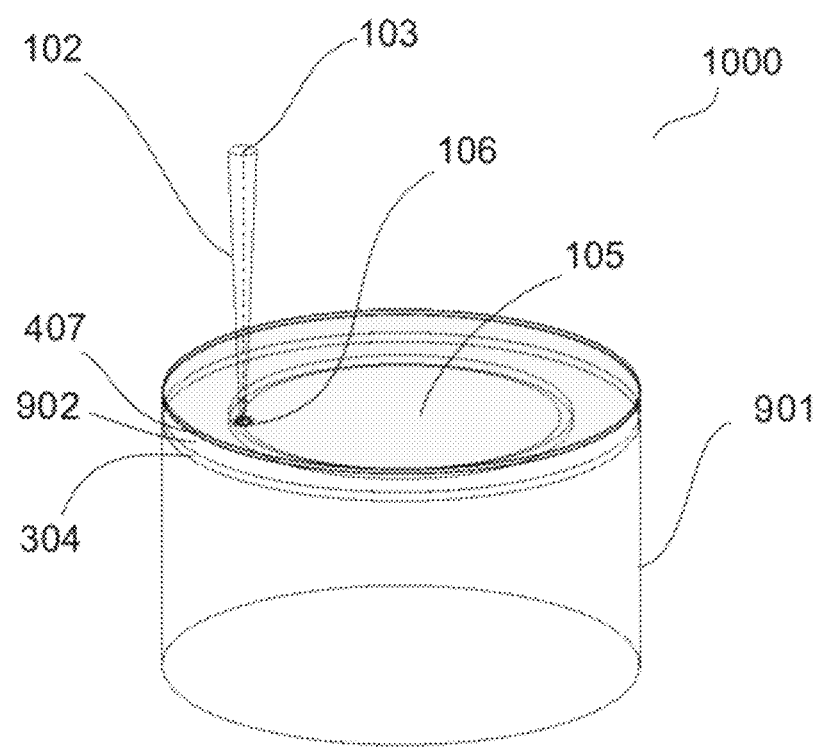

FIG. 10 is the scheme 1000 illustrating the first variation of the method by the example of separating a thin semiconductor washer comprising a grown light diode structure AlGaN/InGaN/AlGaN under the upper surface, from cylindrical semiconductor gallium nitrade boule. For this purpose Nd:YAG laser is used which operates in the mode of modulated Q-factor at λ=532 nm, and generates light pulses with energy of 5 µJ, duration of 5 ns and repetition rate of 1000 Hz. Laser beam is focused to the spot of 16 µm in diameter which provides energy density of 2 J/cm².

Under action of the Nd:YAG laser beam 102 with wavelength λ=532 nm weakly absorbed in the gallium nitride crystal and in light diode structure 407 AlGaN/InGaN/AlGaN, focused under the upper crystal surface 105 at the depth of 50 µm of the cylindrical boule 901, the crystal is locally heated up to temperature higher than 900° C. leading to chemical decomposition of gallium nitride crystal into gaseous nitrogen and liquid gallium in the vicinity 106 of the laser beam focus.

Lateral movement of the laser beam 102 focus on a spiral path at velocity of 1.5 cm/s in the horizontal plane parallel to the crystal surface 105 through which laser beam enters the crystal, and perpendicular to the axis 103 of the focused laser beam 102, leads to consequent decomposition of gallium nitride and to increase of width of the lateral cut 304 on a spiral path from periphery deep into the crystal towards the axis of the cylindrical boule 901. On achieving by the lateral cut 304 the axis of the cylindrical boule 901 in FIG. 10, continuity of the cylindrical gallium nitride boule 901 is disturbed and gallium nitride washer 902 with a grown light diode structure 407 AlGaN/InGaN/AlGaN being higher the cut 304 is separated from the cylindrical gallium nitride boule 901. To avoid cracking of the separable gallium nitride washer 902 caused by thermal stresses, laser cutting is performed at temperature $T_p$=600° C.

Example 9

Figure 11:
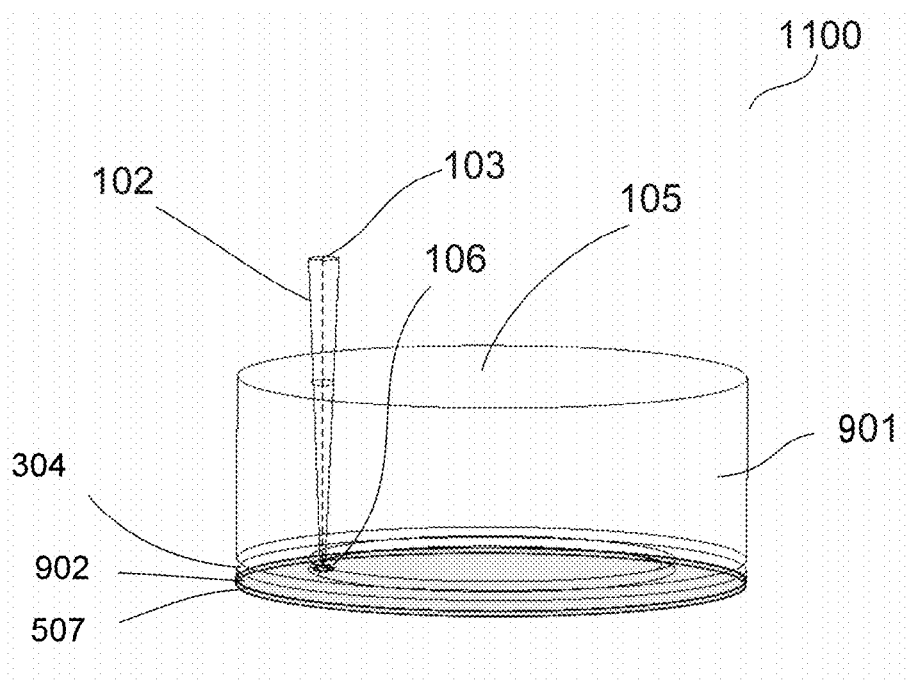

FIG. 11 is the scheme 1100 illustrating the first variation of the method by the example of separating a thin semiconductor washer comprising a grown light diode structure AlGaN/InGaN/AlGaN in the base, from cylindrical semiconductor gallium nitride boule.

For this purpose Nd:YAG laser is used which operates in the mode of modulated Q-factor at λ=532 nm, and generates light pulses with energy of 5 µJ, duration of 5 ns and repetition rate of 1000 Hz. Laser beam is focused to the spot of 16 µm in diameter which provides energy density of 2 J/cm².

Under action of the Nd:YAG laser beam 102 with wavelength λ=532 nm weakly absorbed in the gallium nitride crystal, but absorbed in the light diode structure AlGaN/InGaN/AlGaN, focused deeply under the upper crystal surface 105 of the cylindrical gallium nitride boule 901, the crystal is locally heated up to temperature higher than 900° C. leading to the chemical decomposition of gallium nitride crystal into gaseous nitrogen and liquid gallium in the vicinity 106 of the laser beam focus. Movement of the laser beam 102 focus at velocity of 1.5 cm/s in the horizontal plane parallel to the crystal surface 105 through which laser beam enters the crystal, and perpendicular to the axis 103 of the focused laser beam 102, leads to consequent decomposition of gallium nitride and to increase of width of the lateral cut 304 on a spiral path from periphery deep into the crystal towards the axis of the cylindrical boule 901. On achieving by the lateral cut 304 the axis of the cylindrical boule 901 in FIG. 11, continuity of the cylindrical gallium nitride boule 901 is disturbed and gallium nitride washer 902 with grown light diode structure 507 AlGaN/InGaN/AlGaN lying lower the cut 304 is separated from the cylindrical gallium nitride boule 901.

Example 10

Figure 12:
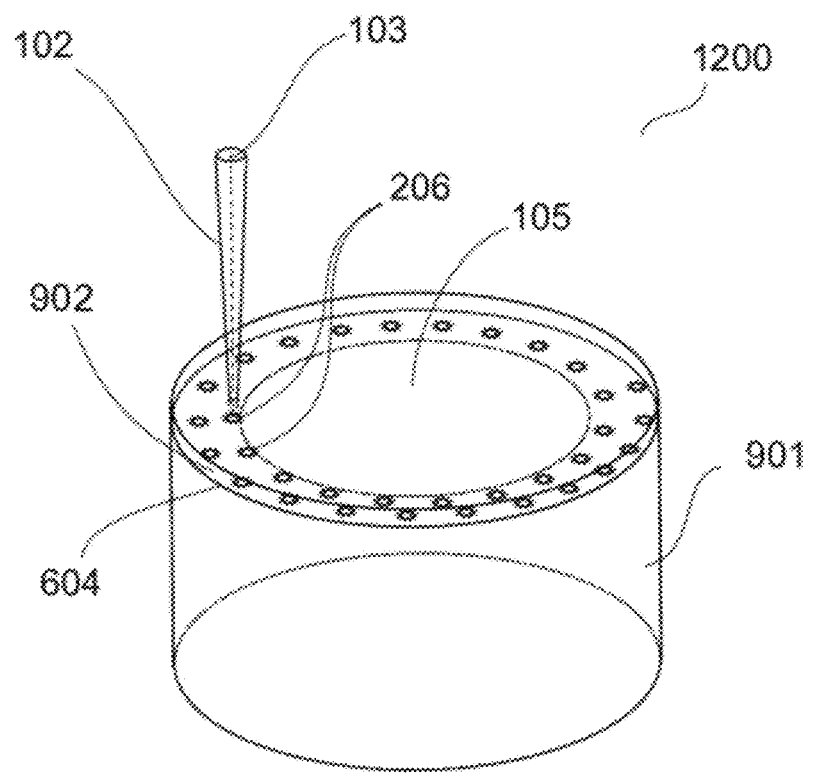

FIG. 12 is a scheme 1200 illustrating the second variation of the method by the example of separating a washer from the semiconductor cylindrical boule of the aluminum nitride crystal. For this purpose Nd:YAG laser is used which operates in the mode of modulated Q-factor at λ=532 nm, and generates pulses with energy of 50 µJ, duration of 5 ns and repetition rate of 10000 Hz. Laser beam is focused to the spot of 1 µm in diameter which provides energy density of 5 J/cm².

Under action of the Nd:YAG laser beam 102 with wavelength λ=532 nm, focused under the surface 105 of cylindrical aluminium nitride boule 901 at the depth of 100 µm, non-overlapping local regions 206 are formed in which structure of chemical bonds is disturbed, chemical interaction between atoms is reduced and mechanical strength of the crystal is decreased. Movement of the laser beam 102 focus at velocity of 5 cm/s in the horizontal plane parallel to the crystal surface 105 through which laser beam enters the crystal, and perpendicular to the axis 103 of the focused laser beam 102, leads to formation of a set of non-overlapping local regions 206 in the lateral plane 604 which is placed under the crystal surface 105 at the depth defined by focusing depth of the laser beam 102. The average distance between the local regions equals 5 µm. Focus of laser beam 102 is moved in the horizontal plane on a spiral path from periphery deep into the crystal towards the axis of the cylindrical boule 901. Area of the plane 604 with a set of the local regions is increased from periphery deep into the crystal towards the axis of the cylindrical boule 901. On achieving the axis of the cylindrical boule 901 with focus, process of laser treatment is finished. Laser treatment is performed at room temperature $T_p$=20° C.

Then cylindrical boule 901 is adhered with upper surface 105 on the aluminium plate and heated to temperature of 100-500° C. In this case, because of thermomechanical stress related with difference between the thermal expansion coefficients of aluminium nitride and aluminium, cylindrical boule 901 of aluminium nitride crystal splits along the mechanically reduced plane 604 with separating a nitride aluminium washer 902 lying higher the plane 604 from the main cylindrical aluminium nitride boule.

Example 11

Figure 13:
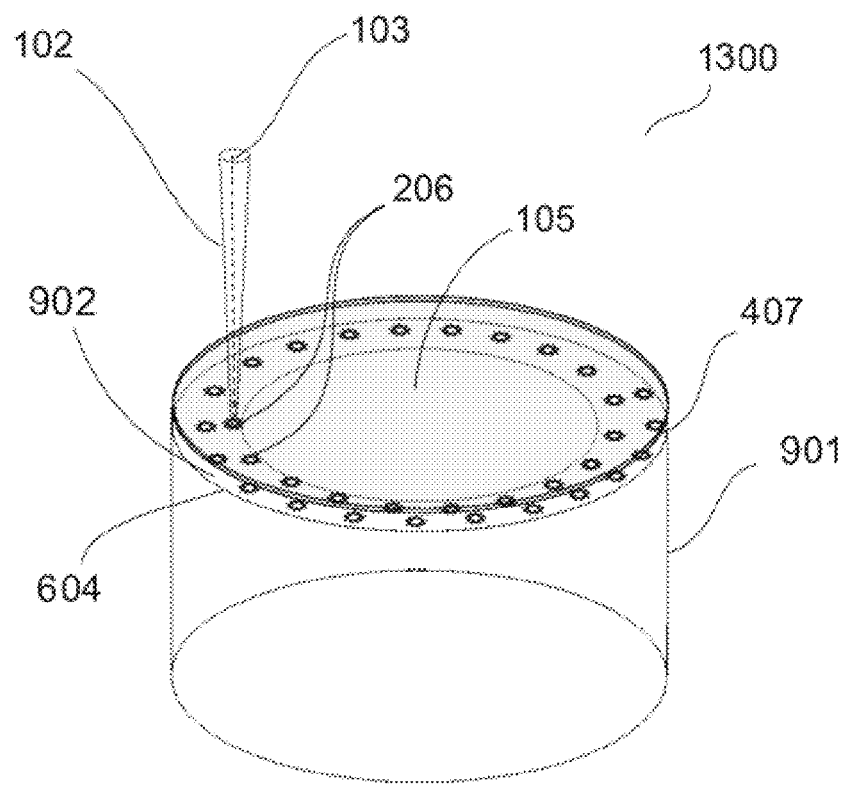

FIG. 13 is the scheme 1300 illustrating the second variation of the method by the example of separating a thin semiconductor washer comprising a grown light diode structure AlGaN/InGaN/AlGaN under the upper surface, from cylindrical semiconductor gallium nitride boule. For this purpose Nd:YAG laser is used which operates in the mode of modulated Q-factor at λ=532 nm, and generates pulses with energy of 50 µJ, duration of 5 ns and repetition rate of 10000 Hz. Laser beam is focused to the spot of 1 µm in diameter which provides energy density of 5 J/cm².

Under action of the Nd:YAG laser beam 102 with wavelength λ=532 nm weakly absorbed in the gallium nitride crystal and in the light diode structure 407 AlGaN/InGaN/AlGaN, focused under the cylindrical boule surface 105 at the depth of 50 µm, non-overlapping local regions 206 are formed in which structure of chemical bonds is disturbed, chemical interaction between atoms is reduced and mechanical strength of the crystal is decreased. Focus of the laser beam 102 is moved at velocity of 5 cm/s in the horizontal plane on a spiral path from periphery deep into the crystal towards the axis of the cylindrical boule 901. Area of the plane 604 with a set of non-overlapping local regions 206 is increased from periphery deep into the crystal towards the axis of the cylindrical boule 901. The average distance between the local regions equals 5 μm. On achieving the axis of the cylindrical boule 901 with focus, process of laser treatment is finished. Laser treatment is performed at room temperature $T_p=20°$ C.

Then cylindrical boule 901 of gallium nitride crystal is adhered with upper surface 105 on the aluminium plate and heated to temperature of 100-500° C. In this case, because of thermomechanical stress related with difference between the thermal expansion coefficients of gallium nitride and aluminium, cylindrical boule 901 of aluminium nitride crystal splits along the mechanically reduced plane 604 with separating a gallium nitride washer 902 with a grown light diode structure 407 AlGaN/InGaN/AlGaN lying higher the plane 604 from the main cylindrical gallium nitride boule.

Example 12

Figure 14:
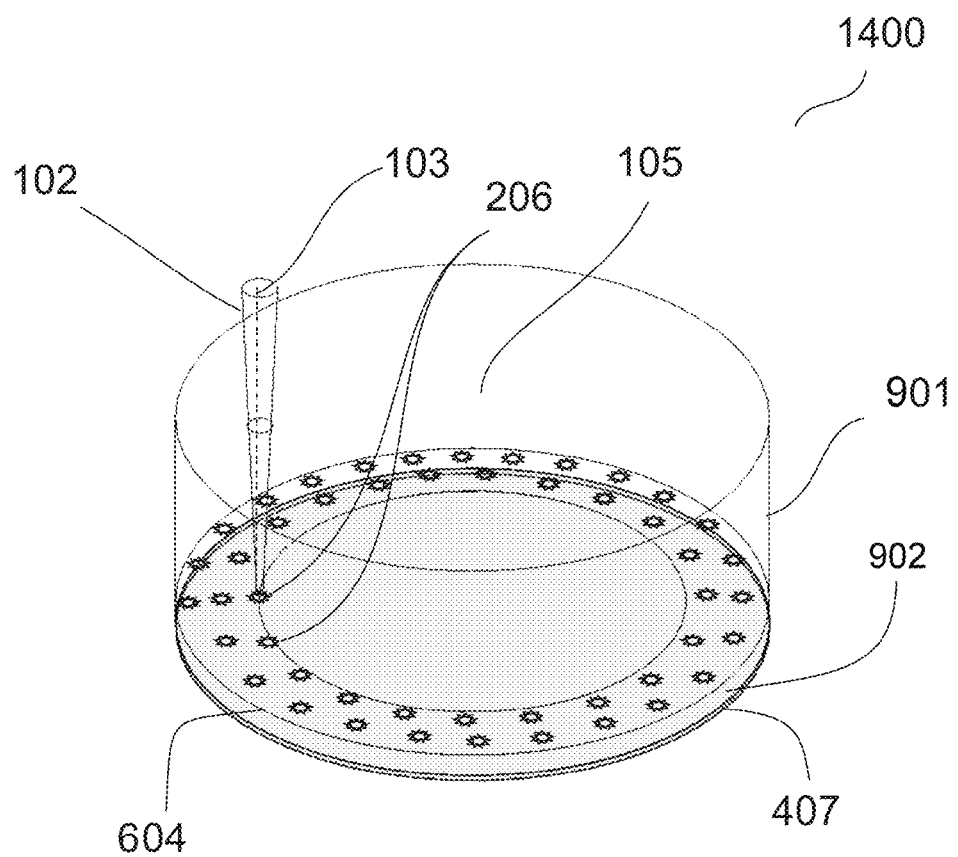

FIG. 14 is the scheme 1400 illustrating the second variation of the method by the example of separating a thin semiconductor washer comprising a grown light diode structure AlGaN/InGaN/AlGaN in the base, from cylindrical semiconductor gallium nitride boule.

For this purpose Nd:YAG laser is used which operates in the mode of modulated Q-factor at λ=532 nm, and generates pulses with energy of 50 μJ, duration of 5 ns and repetition rate of 10000 Hz. Laser beam is focused to the spot of 1 μm in diameter which provides energy density of 5 J/cm².

Under action of the Nd:YAG laser beam 102 with wavelength λ=532 nm weakly absorbed in the gallium nitride crystal, but absorbed in the light diode structure 407 AlGaN/InGaN/AlGaN, focused deeply under the surface 105 of the boule 901, non-overlapping local regions 206 are formed in which structure of chemical bonds is disturbed, chemical interaction between atoms is reduced and mechanical strength of the crystal is decreased. Focus of the laser beam 102 is moved at velocity of 5 cm/s in the horizontal plane on a spiral path from periphery deep into the crystal towards the axis of the cylindrical boule 901. Area of the plane 604 with a set of non-overlapping local regions 206 is increased from periphery deep into the crystal towards the axis of the cylindrical boule 901. The average distance between local regions equals 5 μm. On achieving the axis of the cylindrical boule 901 with focused laser beam 102, process of laser treatment is finished. Laser treatment is performed at room temperature $T_p=20°$ C.

Then cylindrical boule 901 of gallium nitride crystal is adhered with upper surface 105 on the aluminium plate and heated to temperature of 100-500° C. In this case, because of thermomechanical stress related with difference between the thermal expansion coefficients of gallium nitride and aluminium, cylindrical boule 901 of aluminium nitride crystal splits along the mechanically reduced plane 604 with separating a gallium nitride washer 902 with a grown light diode structure 407 AlGaN/InGaN/AlGaN lying lower the plane 604 from the main cylindrical gallium nitride boule.

Despite that this invention has been described and illustrated by examples of the invention embodiments, it should be noted that this invention by no means is not limited by the examples given.

What is claimed is:

1. A method of separating a surface layer of a monolithic semiconductor crystal or crystal boule, the monolithic semiconductor crystal or crystal boule having a top surface and a bottom surface, the method comprising:
   generating a pulsed laser beam having a wavelength λ in a range of $2\pi ch/E_g \leq \lambda \leq c/v_0$, wherein $E_g$, is a forbidden gap for the monolithic semiconductor crystal or crystal boule, $v_0$ is a frequency of an optical phonon for the monolithic semiconductor crystal or crystal boule, c is a velocity of light and h is a Plank constant;
   directing the pulsed laser beam onto the top surface the monolithic semiconductor crystal or crystal boule and focusing the pulsed laser beam such that a focus of the pulsed laser beam is placed in a separation plane perpendicular to an axis of the pulsed laser beam, the separation plane located intermediate the top surface and the bottom surface;
   moving the pulsed laser beam such that the focus of the pulsed laser beam is moved along an entirety of the separation plane while forming non-overlapping local regions in which structure of chemical bonds is disturbed, chemical interaction between atoms is reduced, and mechanical strength is decreased wherein the surface layer of the monolithic semiconductor crystal or crystal boule extends from the separation plane to the top surface;
   applying an external action to the surface layer, the external action destroying the reduced chemical interaction between atoms of the non-overlapping local regions, wherein the destroying causes complete separation of the surface layer of the monolithic semiconductor crystal or crystal boule along the separation plane.

2. The method according to claim 1, wherein the external action is a mechanical action.

3. The method according to claim 2, wherein the mechanical action is a mechanical stress applied to the surface layer in relation to the monolithic semiconductor crystal or crystal boule.

4. The method according to claim 1, wherein a distance between the centers of the non-overlapping local regions is 3%-30% of a thickness of the surface layer.

5. The method according to claim 1, wherein the surface layer of the monolithic semiconductor crystal or crystal boule contains grown in layered semiconductor device structure.

* * * * *